United States Patent [19]

Ueki et al.

[11] Patent Number: 5,414,576
[45] Date of Patent: May 9, 1995

[54] SPACE SAVING CONFIGURATION OF A PRINTED CIRUCIT BOARD FOR A MAGNETIC HEAD ON A FLEXURE SEAT FOR THE HEAD

[75] Inventors: Jiro Ueki, Fuchu; Fumio Nagase, Tama, both of Japan

[73] Assignee: TEAC Corporation, Tokyo, Japan

[21] Appl. No.: 74,224

[22] Filed: Jun. 9, 1993

[30] Foreign Application Priority Data

Jun. 12, 1992 [JP] Japan ............................ 4-047118 U

[51] Int. Cl.⁶ .................... G11B 21/04; G11B 21/16
[52] U.S. Cl. ................................ 360/104; 360/108; 361/749
[58] Field of Search ...................... 360/103–106, 360/108; 29/829–832; 361/749

[56] References Cited

U.S. PATENT DOCUMENTS

| 4,597,719 | 5/1986 | Barth | 361/749 |
| 4,819,108 | 4/1989 | Seki et al. | 360/104 |
| 5,343,344 | 8/1994 | Nagase | 360/104 |

FOREIGN PATENT DOCUMENTS

| 59-218625 | 12/1984 | Japan | 360/103 |
| 61-227219 | 10/1986 | Japan | 360/103 |
| 4146516 | 5/1992 | Japan | 360/103 |
| 4271008 | 9/1992 | Japan | 360/103 |

*Primary Examiner*—Stuart S. Levy
*Assistant Examiner*—David D. Davis
*Attorney, Agent, or Firm*—Woodcock, Washburn Kurtz, Mackiewicz & Norris

[57] ABSTRACT

A disk drive has a pair of transducers mounted to respective planar flexure seats and electrically connected to respective flexible printed circuit boards for data transfer with the opposite sides of a rotating flexible magnetic disk. One of the transducers, mounted to a pivoted load arm on a carriage, is moved away from the other transducer when the disk is being loaded in and unloaded from the disk drive. In order to prevent the conductive pattern on the circuit board for this one transducer from contacting the metal made top wall of the disk drive casing, the circuit board is shaped to include a major portion disposed on the back side of the flexure seat, opposite to the front side on which the transducer is mounted. The circuit board is further provided with a first pair of flaps which extend in opposite directions from the major portion and which are folded onto the front side of the flexure seat, and a second pair of flaps which extend right angularly from the first pair of flaps and which are folded, after having been folded together with the first pair of flaps onto the first side of the flexure seat, back onto the second side thereof so as to cover parts of the conductive pattern on the major portion. The transducer has its leads soldered to the conductive pattern on the first pair of flaps.

8 Claims, 5 Drawing Sheets

SPACE SAVING CONFIGURATION OF A PRINTED CIRUCIT BOARD FOR A MAGNETIC HEAD ON A FLEXURE SEAT FOR THE HEAD

BACKGROUND OF THE INVENTION

This invention relates to rotating disk data storage apparatus in general and, in particular, to the improved space saving configuration of a flexible printed circuit board, to which a magnetic data transducer or head is electrically connected, on a planar flexure seat resiliently supporting the transducer. The invention represents an improvement of the copending U.S. patent application Ser. No. 875,454 filed Apr. 29, 1992, by Nagase under the title of "Improved Connection of Transducer Leads to a Printed Circuit Board in Rotating Disk Data Storage Apparatus" and assigned to the assignee of the instant application.

The three and a half inch flexible magnetic disk and disk drives for use therewith have won widespread commercial acceptance. The disk is rotatably housed in a generally flat, boxlike envelope of relatively rigid plastic material, complete with a metal made sliding shutter, to make up a disk cassette. The envelope has a pair of apertures of rectangular shape to expose radial portions of the opposite sides of the disk. The sliding shutter also has a pair of apertures of approximately the same shape and size as the envelope apertures, which shutter apertures come into and out of register with the envelope apertures with the movement of the shutter relative to the envelope. The magnetic disk has a rigid hub of magnetic sheet metal attached centrally thereto. The hub has defined therein a central opening of square shape and an eccentric opening of rectangular shape.

When positioned in the associated disk drive, the magnetic disk has its central hub placed on a turntable which is much less in diameter than the disk. The turntable has a permanent magnet mounted thereto for attracting the disk hub. Disposed centrally on the turntable, a spindle engages in the central opening in the disk hub for centering the disk on the turntable. A drive pin is disposed eccentrically on the turntable for driving engagement in the eccentric opening or slot in the disk hub, imparting the rotation of the turntable to the disk.

The disk drive has a pair of magnetic data transducers or read/write heads for data transfer with the opposite sides of the disk through the registered envelope and shutter apertures. One of the transducers is mounted via a planar flexure seat on a carriage movable across the annular, concentric data tracks on the disk. The other transducer is mounted via another planar flexure seat on a load arm which is hingedly mounted to the carriage for pivotal motion toward and away from the disk.

Usually, with this type of disk drive, the lead wires or pins of each transducer were soldered to a conductive pattern on a flexible printed circuit board disposed on that side of the associated flexure seat opposite to the one on which the transducer was mounted. Each soldered joint rose to a height of 0.3 to 0.6 millimeters. Negligible as it might seem, the solder of such height represented a serious inconvenience in reducing the thickness or height of the disk drive to an absolute minimum, as is the trend today.

It might be contemplated to dispose the flexible printed circuit boards on the same side of the flexure seats as the transducers. This solution is objectionable because then the circuit boards might contact the envelope of the disk cassette. Particularly in the case where the envelope has the metal made sliding shutter, the conductive patterns on the circuit boards might be thereby short circuited to the destruction of the transducers.

Another solution is found in Nagase U.S. patent application Ser. No. 875,454, supra. In this application each printed circuit board, generally disposed on that side of the flexure seat opposite to the side where the transducer was mounted, was shaped to include a pair of end portions which were bent and folded through openings in the flexure seat onto the same side as the transducer. The transducer leads were soldered to these folded end portions of the circuit board. Consequently, the solder itself represents no bar to the reduction of the thickness of the disk drive.

This solution has proved still unsatisfactory, however. Should the thickness of disk drive be lessened to a greater extent than heretofore, the conductive pattern on tile circuit board for the upper transducer, mounted to the pivoted load arm, might come into contact with the metal made top cover of the disk drive.

An obvious remedy to this problem might be to provide some electrically insulating overlay on the circuit board or on the conductive pattern. The coating of an insulating paint would be one possible method to this end, but it would take too much cost and labor in consideration of coatings of constant, appropriate thickness required. The adhesion of insulating sheet or film would be another practicable method. However, such sheet or film would not only add to the weight of the circuit board but also impair the flexibility of the circuit board and, in consequence, the resiliency of the flexure seat. These inconveniences would be overcome if the small pieces of insulating sheet or film were attached to only those parts of the conductive pattern which might contact the top cover of the disk drive. This method is also objectionable in view of the cost and labor involved.

The applicant has also contemplated to cover with flexible overlays the complete surfaces of printed circuit boards having the conductive patterns formed thereon. Parts of the overlays may then be removed for exposing those parts of the conductive patterns to which the transducer overlays are to be soldered. An objection to this measure is that, flexible as they may be, the overlays would nevertheless lessen the flexibility of the circuit boards. The partial removal of the overlays would also be very troublesome.

SUMMARY OF THE INVENTION

The present invention seeks to overcome all the inconveniences and weaknesses pointed out above and to provide a truly space saving configuration of a flexible printed circuit board a magnetic transducer in rotating disk data storage apparatus of the kind defined, such that the conductive pattern on the circuit board will make no direct contact with the metal made top cover or like overlying or neighboring part of the apparatus.

Briefly, the invention provides, in an apparatus for data transfer with a rotating data storage disk, the combination comprising carriage means movable substantially radially of the disk, and a substantially planar flexure seat mounted to the carriage means, the flexure seat having a first side directed toward the disk and a second side directed away therefrom. Also included is a flexible printed circuit board constituting a feature of this invention. The circuit board, with a conductive pattern formed thereon, is shaped to include a major portion and a first and a second pair of flaps. The major portion of the circuit board is disposed on the second side of the disk. Extending in opposite directions from the major portion, the first pair of flaps are folded from the second onto the first side of the flexure seat. The second pair of flaps extend right angularly, and in the same direction, from the first pair of flaps, respectively. After having been folded together with the first pair of flaps onto the first side of the flexure seat, the second pair of flaps are folded back onto the second side of the flexure seat and cover at least parts of the conductive pattern on the major portion of the circuit board. A transducer is mounted to the first side of the flexure seat and has its leads soldered or otherwise electrically connected to the conductive pattern on the first pair of flaps of the circuit board.

Thus, according to the invention, those parts of the conductive pattern on the flexible printed circuit board which may contact the metal made top wall of the apparatus are covered by the second pair of flaps of the circuit board itself. No separate cover sheets are therefore necessary. It will also be appreciated that the exactly required parts of the conductive pattern can be covered, all that is required for this purpose being to fold the first pair of flaps from the second to the first side of the flexure seat and then to fold back the second pair of flaps from the first to the second side of the flexure seat.

Preferably, the flexible printed circuit board may have an adhesive layer preformed on its side opposite to the one on which the conductive pattern is formed. The mounting of the circuit board to the flexure seat, and the covering of the required parts of the conductive pattern, will then become still easier.

The above and other features and advantages of this invention and the manner of realizing them will become more apparent, and the invention itself will best be understood, from a study of the following description and appended claims, with reference had to the attached drawings showing a preferred embodiment of the invention.

DESCRIPTION OF THE PREFERRED EMBODIMENT

Figure 1:
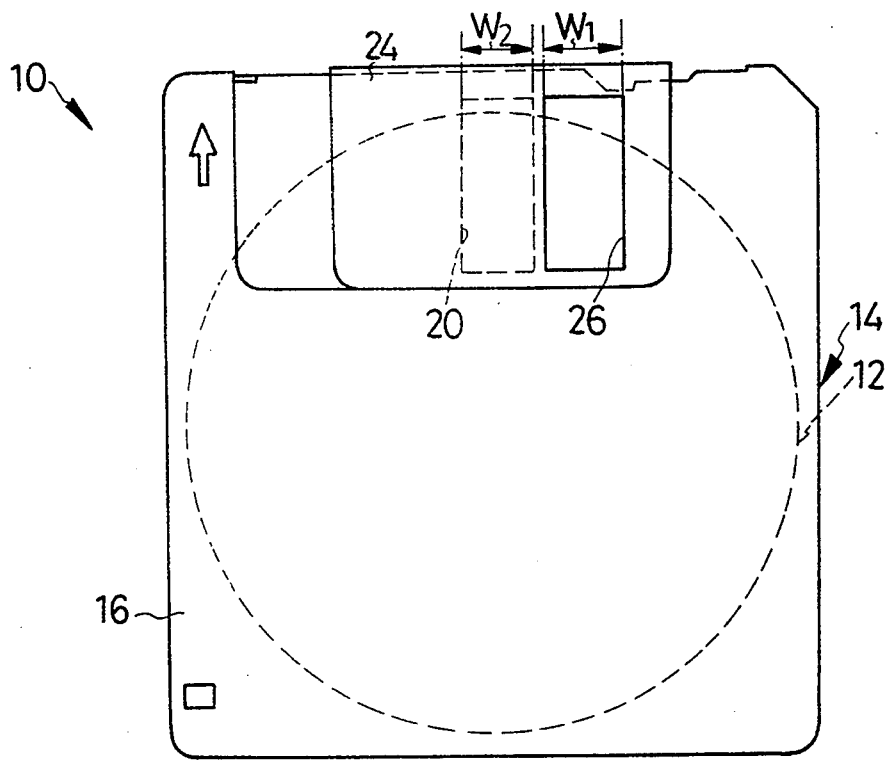
FIG. 1 is a top plan view of the known flexible magnetic disk cassette for use with the apparatus constructed in accordance with the present invention.

The known three and a half inch flexible magnetic disk cassette for use with the apparatus according to this invention will be first briefly described, the better to make the features and advantages of the invention. Generally designated 10 in FIGS. 1 and 2, the disk cassette has a flexible magnetic disk 12 rotatably housed in a protective envelope 14 of rigid plastic material. The envelope 14 is of square, rather flat box-like shape, having a front or top side 16 seen in FIG. 1 and a rear or bottom side 18 seen in FIG. 2.

Formed in both top 16 and bottom 18 sides of the envelope 14, and in the vicinity of one edge thereof, are apertures 20 and 22 of rectangular shape which are in register with each other. The apertures 20 and 22 expose radial portions of the opposite sides of the magnetic disk 12 for data transfer contact with a pair of magnetic data transducers or heads of the associated data storage apparatus to be discussed subsequently.

Normally, the apertures 20 and 22 in the envelope 14 are both closed by a sliding shutter 24 in the form of a rectangular piece of sheet metal bent into the shape of a U and slidably mounted astride one edge of the envelope 14. The shutter 24 has itself two apertures 26 and 28 of approximately the same shape and size as the envelope apertures 20 and 22. The shutter apertures 26 and 28 are out of register with the envelope apertures 20 and 22 when the shutter is in the illustrated right hand position under the bias of the spring (not shown).

Figure 2:
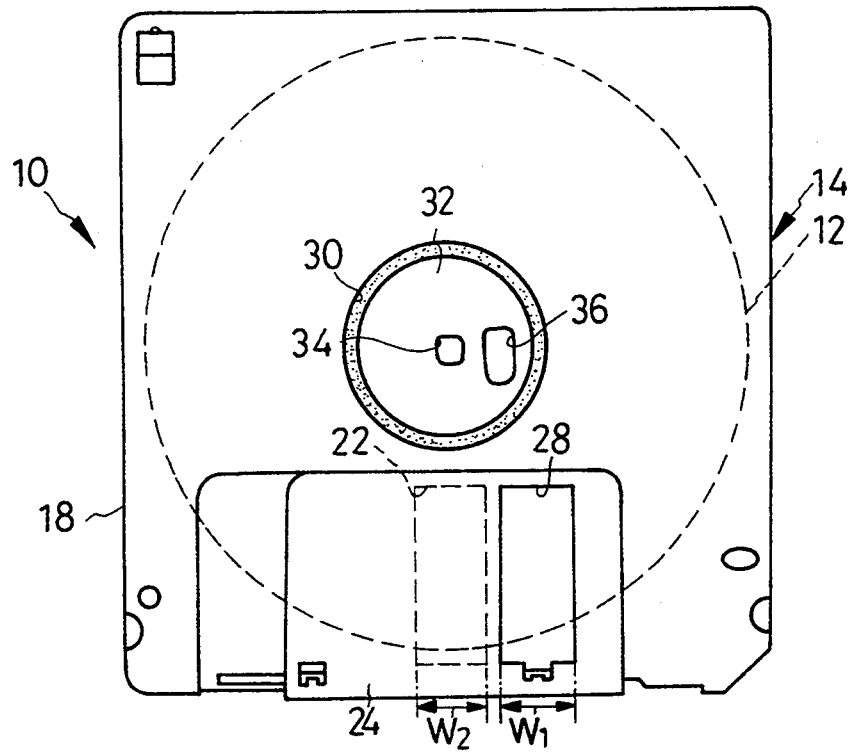
FIG. 2 is a bottom plan view of the magnetic disk cassette of FIG. 1.

When the disk cassette 10 is loaded in position in the associated apparatus, the shutter 24 will be forced leftwardly, as viewed in FIGS. 1 and 2, of the envelope 14 against the force of the unshown spring. Thereupon the shutter apertures 26 and 28 will come into register with the envelope apertures 20 and 22 thereby exposing the radial portions of the opposite sides of the disk 12 for data transfer with the data transducers of the apparatus.

The disk cassette 10 is to be placed upon the turntable of the apparatus with the top side 16 of its envelope 14 oriented upwardly. Therefore, as shown in FIG. 2, the bottom side 18 of the envelope 14 has a circular opening 30 formed centrally therein to afford working engagement of the disk 12 with the turntable. Exposed through the opening 30 is a hub 32 in the form of a disk of magnetic sheet metal attached centrally to the disk. The hub 32 has defined therein a central opening 34 of square shape and an eccentric opening 36 of rectangular shape.

Figure 3:
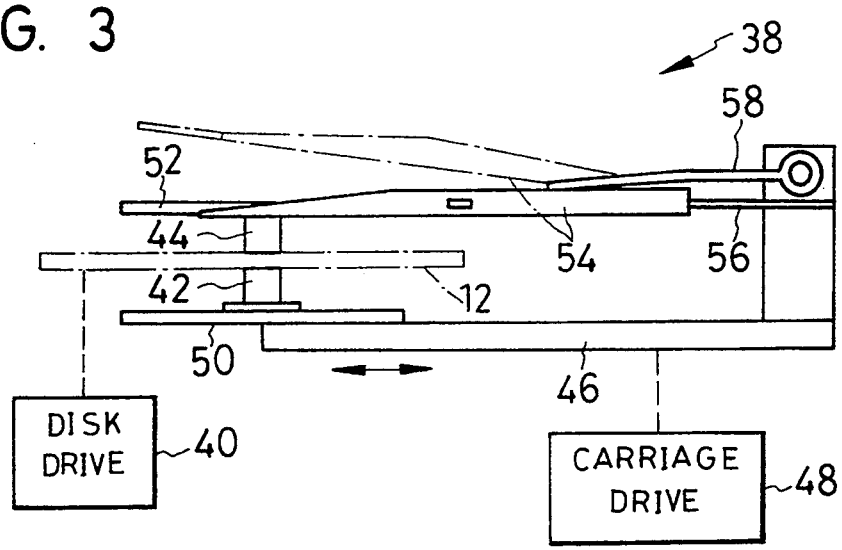
FIG. 3 is a partial side elevation, partly in block form, of the rotating disk data transfer apparatus for use with the disk cassette of FIGS. 1 and 2.

Reference is now directed to FIG. 3 for a study of the apparatus 38 for data transfer with the disk cassette 10 of the FIGS. 1 and 2 construction. The data transfer apparatus 30 has a disk drive mechanism 40 which is shown in block form because of its conventional and well known nature. In practice the disk drive mechanism 40 may comprise an electric motor coupled directly to an overlying turntable via a drive spindle.

FIG. 3 shows the only the flexible magnetic disk 12 of the disk cassette loaded in the apparatus 38 and held in a preassigned data transfer position therein, with the hub 32, FIG. 2, of the disk placed concentrically upon the turntable. The drive spindle projects upwardly from the turntable for centering engagement in the central opening 34 in the disk hub 32. A drive pin, not shown, is resiliently and eccentrically mounted on the turntable for driving engagement in the eccentric slot 36 in the disk hub 32, imparting the rotation of the turntable to the disk 12 within the cassette envelope 14.

The data transfer apparatus 38 is conventionally equipped with a pair of data transducers or magnetic read/write heads 42 and 44 for data transfer with the opposite sides of the disk 12. The transducers 42 and 44 are both mounted to a carriage 46 for traveling substantially radially of the disk 12 across a multiplicity of annular concentric record tracks, not shown, thereon.

A carriage drive mechanism 48 for linearly and incrementally moving the carriage 46 with the transducers 42 and 44 thereon is also shown as a block because of its conventional nature. An example of carriage drive mechanism comprises a bidirectional motor of the known electric stepping type and a motion translating mechanism such as a lead screw for converting the bidirectional, incremental rotation of the stepper motor into the linear, stepwise, reciprocating motion of the carriage 46.

Although the first or bottom transducer 42 is mounted directly to the carriage 46 via a flexure seat 50, the second or top transducer 44 is mounted via another flexure seat 52 to a distal end of a load arm 54. This load arm is in turn hingedly mounted to the carriage via a cantilever spring 56 for pivotal motion between the solid line working position and phantom retracted position of FIG. 3 in a plane normal to the plane of the disk 12 on the turntable. A torsional load spring 58 acts on the load arm 54 for holding the same in the working position in which both transducers 42 and 44 are loaded against the disk 12. The load arm 54 together with the top transducer 44 is to be retracted against the force of the load spring 58 for permitting the disk cassette 10 to be loaded in, and unloaded from, the apparatus 38.

Mounted to the flexure seat 50, the bottom transducer 42 has its leads, not shown, soldered to a flexible printed circuit board, also not shown, in a conventional manner. Reference may be had to the aforementioned Nagase U.S. patent application Ser. No. 875,454 for more details on this subject.

Figure 4:
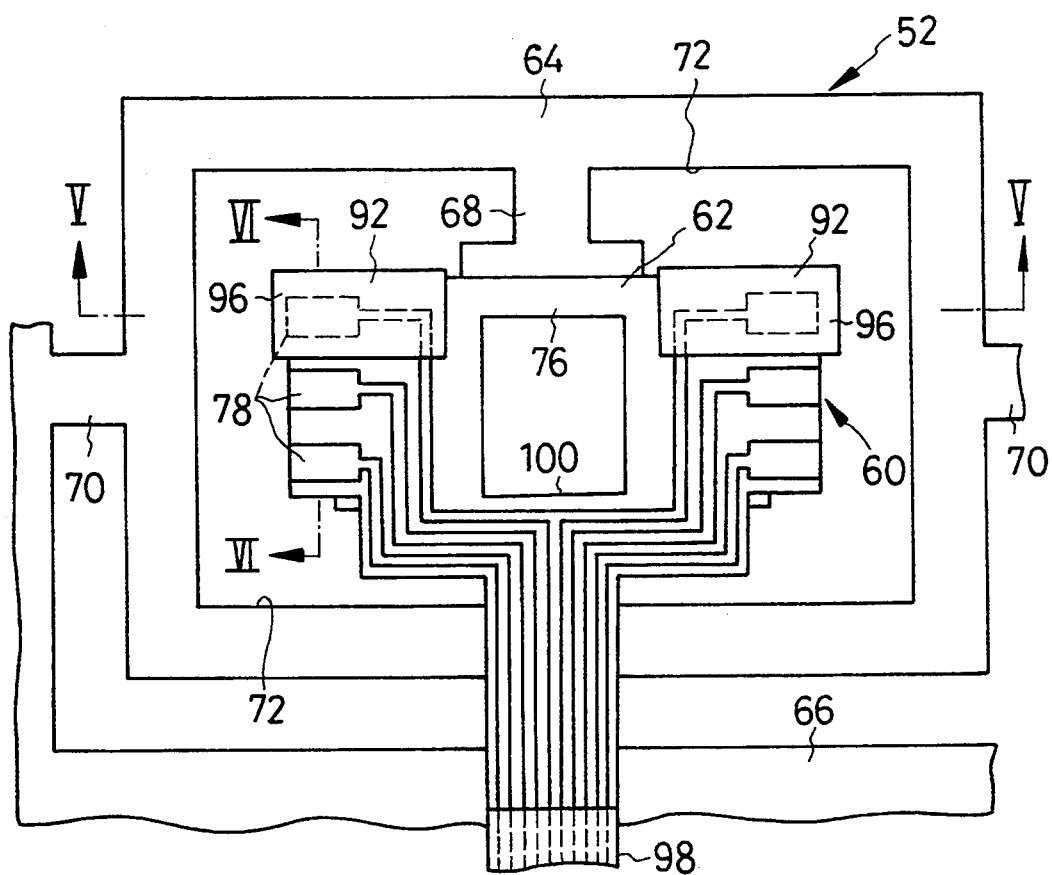
FIG. 4 is an enlarged top plan view of the flexible printed circuit board for the top transducer of the FIG. 3 apparatus, the circuit board being shown mounted to the flexure seat which is shown fragmentarily.
Figure 5:
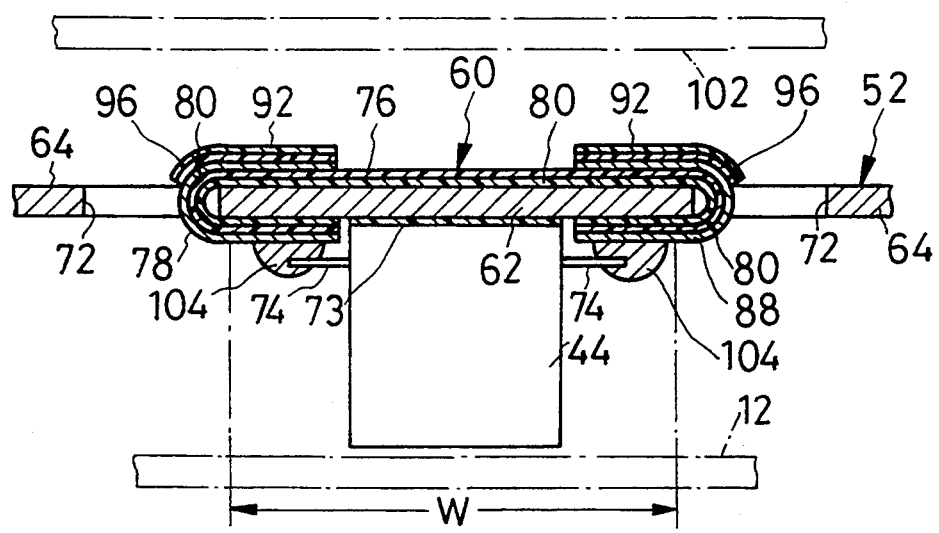
FIG. 5 is a section taken along the line V—V in FIG. 4 and also showing the top transducer mounted to the flexure seat.
Figure 6:
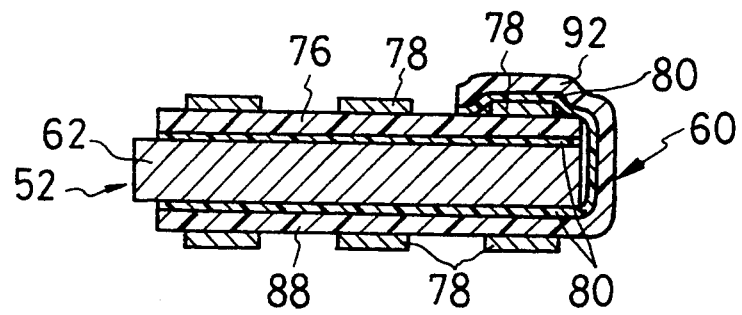
FIG. 6 is an enlarged section taken along the line VI—VI in FIG. 4.

As illustrated in detail in FIGS. 4–6, the top transducer 44 is mounted to the underside of the flexure seat 52 and electrically connected to another flexible printed circuit board 60. The present invention is specifically directed to the improved configuration of this circuit board 60 in conjunction with the top transducer 44 and flexure seat 52, as set forth in detail hereinbelow.

Figure 7:
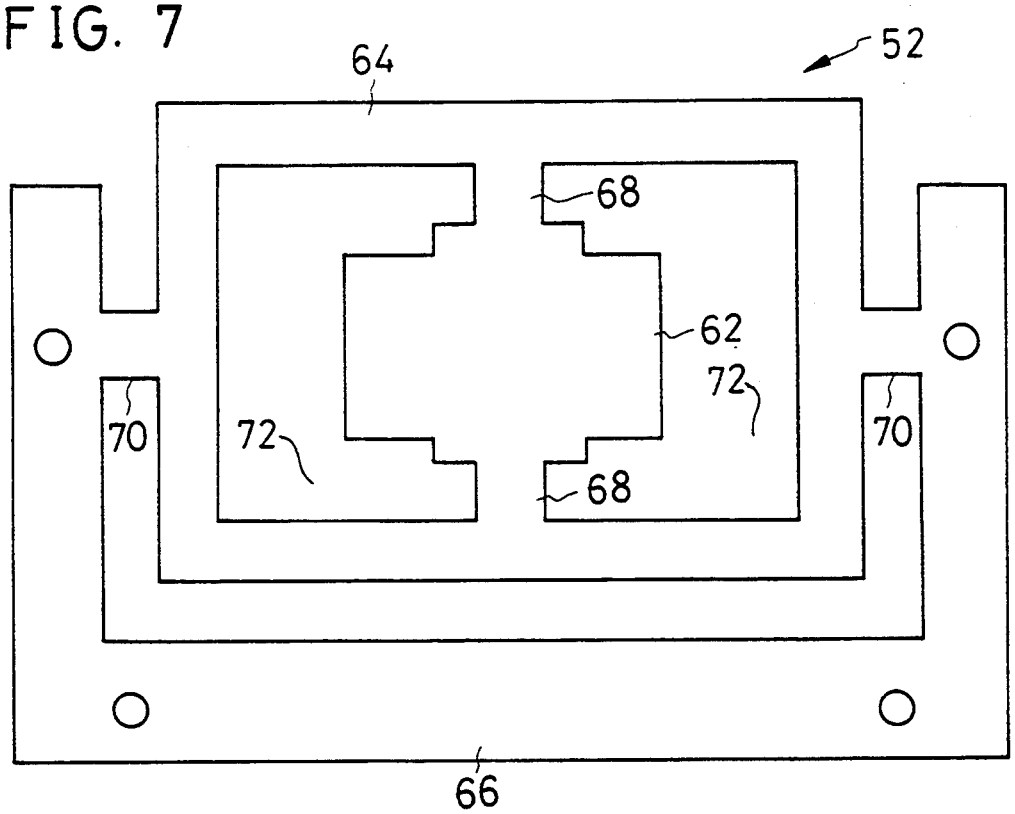
FIG. 7 is a plan view of the flexure seat for the top transducer.

Although FIGS. 4–6 all show the flexure seat 52 for the top transducer 44, FIG. 7 better illustrates its construction. Typically, for supporting the top transducer 44 in a gimbal fashion, the flexure seat 52 takes the form of a sheet metal punching comprising a generally rectangular central portion 62, an annular portion 64 surrounding the central portion, and a U shaped portion 66 partly surrounding the annular portion. The central portion 62 is joined to the annular portion 64 via a pair of relatively slender bridges 68 arranged collinearly on the opposite sides of the central portion. The annular portion 64 is joined in turn to the U shaped portion 66 via another pair of relatively slender bridges 70 arranged collinearly on the opposite sides of the annular portion and extending in right angular relationship to the first pair of bridges 68. As the central portion 62 is bridged to the surrounding annular portion 64 as above, a pair of openings 72 are formed on both sides of the central portion. These openings 72 are utilized for mounting the circuit board 60 to the flexure seat 52 according to the invention.

The flexure seat 52 of the foregoing construction is mounted to the load arm 54, FIG. 3, by having its U shaped portion 66 fastened to the bifurcated end of the load arm. Consequently, affixed to the central portion 62 of the flexure seat 52 via an adhesive layer 73, the top transducer 44 is pivotable in every direction within limits about the two orthogonal axes along the two pairs of bridges 68 and 70 of the flexure seat. It will also be noted from FIG. 3 that the flexure seat 52 has a first or bottom side directed toward the disk 12 and a second or top side directed away therefrom. The top transducer 44 is of course mounted to the first side of the flexure seat 52.

As will be understood by referring again to FIGS. 4–6, the flexible printed circuit board 60 is generally mounted to the second side of the flexure seat 52. Parts of the circuit board 60, however, are folded onto the first side of the flexure seat 52 for electrical connection to the leads 74, FIG. 5, of the top transducer 44.

Figure 8:
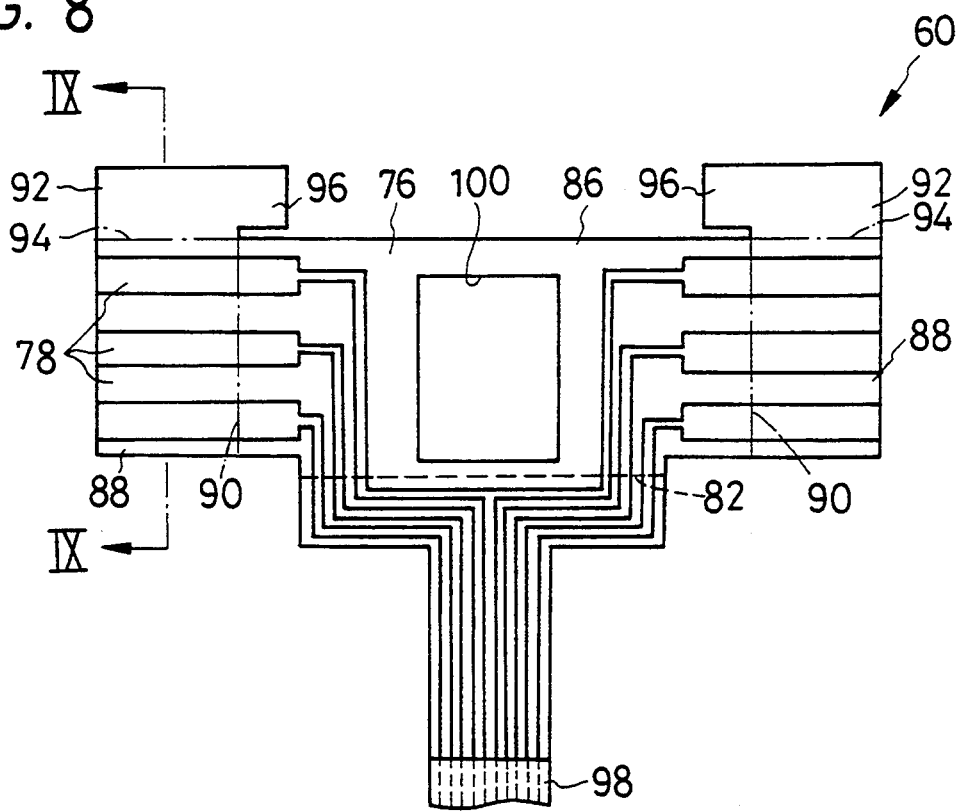
FIG. 8 is a top plan view of the flexible printed circuit board for the top transducer, the circuit board being herein shown unfolded.
Figure 9:
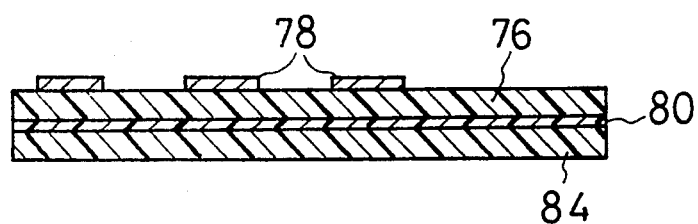
FIG. 9 is an enlarged section taken along the line IX—IX in FIG. 8.
Figure 10:
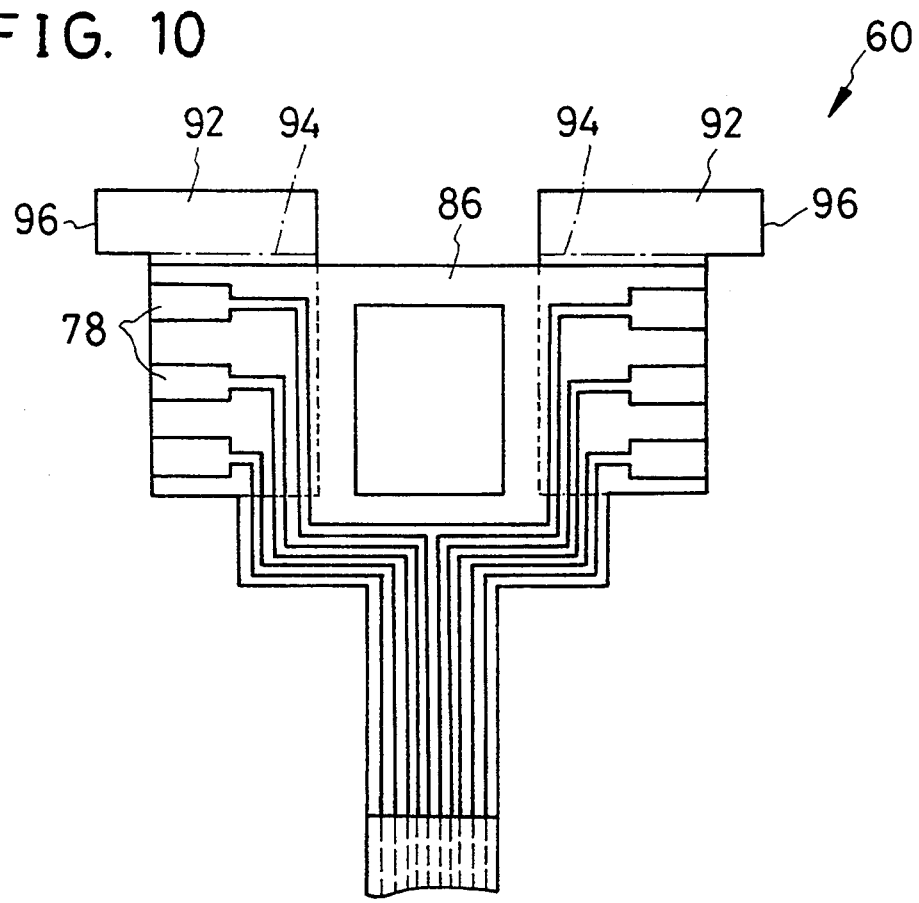
FIG. 10 is a view similar to FIG. 8 except that the flexible printed circuit board is shown with its first pair of flaps folded, and with the second pair of flaps still unfolded.

FIGS. 8 and 9 show the circuit board 60 in developed form, and FIG. 10 the same circuit board in folded form. FIG. 8 best indicates that the circuit board 60 has an electrically insulating base board 76 which is substantially T shaped, as viewed in a plan view as in this figure, and an electrically conductive pattern 78 formed on a top surface of the base board 76. An adhesive layer 80, FIG. 9, is formed on the bottom surface of that part of the base board 76 which is seen above a dashed line 82, FIG. 8. FIG. 9 also shows that the adhesive layer 80 is covered with a cover sheet 84 which is to be peeled off when the circuit board 60 is bonded to the flexure seat 52.

For the purposes of this invention, the circuit board 60 may be thought of as consisting essentially of a major portion 86, a first pair of flaps 88 extending in opposite directions from the major portion and shown bounded off therefrom by a pair of dot and dash lines 90, and a second pair of flaps 92 extending right angularly, and in the same direction, from the first pair of flaps 88, respectively, and shown bounded off therefrom by another pair of dot and dash lines 94. Preferably, and as seen in both FIGS. 8 and 10, the second pair of flaps 92 may be formed to include a pair of extensions 96 which extend to a relatively short extent toward each other when the circuit board 60 is developed as in FIG. 8, and away from each other when the circuit board is folded as in FIG. 10.

FIG. 4 shows that an overlay 98 of electrically insulating material covers only that part of the conductive pattern 78 on the circuit board 60 which is located away from the flexure seat 52, or from its annular portion 64. The other part of the conductive pattern 78 may be left exposed so as not to add to the weight of the circuit board 60 or to interfere with the resiliency of the flexure seat 52. It is also recommended for the same purposes that an opening 100, which may be as large as practical, be formed in the major portion 86 of the circuit board 60.

For mounting the circuit board 60 to the flexure seat 52, the cover sheet 84 of FIG. 9 may first be peeled off the adhesive layer 80 on the circuit board. Then the major portion 86 of the circuit board 60, still unfolded as shown in FIG. 8, may be bonded via the adhesive layer 80 to the top side of the central portion 62 of the flexure seat 52. Then the first pair of flaps 88 of the circuit board 60 may be folded along the first pair of dot and dash lines 90 onto the bottom side of the flexure seat central portion 62 through the pair of openings 72 in the flexure seat. Then the first pair of circuit board flaps 88 may be bonded to the bottom side of the flexure seat central portion 62 via the adhesive layer 80.

FIG. 10 shows the circuit board 60 with its first pair of flaps 88, not seen here, folded as above onto the bottom side of the flexure seat central portion. It will be understood that the second pair of circuit board flaps 92 have been folded together with the first pair of circuit board flaps 88 onto the bottom side of the flexure seat. Consequently, the pair of extensions 96 of the second pair of circuit board flaps 92 now extend away from each other, and the adhesive layer on these flaps and extensions are directed toward the viewer as seen in FIG. 10.

Then, as illustrated in FIGS. 4–6, the second pair of circuit board flaps 92 may be folded along the second pair of dot and dash lines 94 back onto the top side of the flexure seat central portion 62 and bonded to the circuit board major portion 86 via the adhesive layer 80. Thus folded, the second pair of circuit board flaps 92 will overlie those parts of the conductive pattern 78 on the circuit board major portion 86 which are farthest away from the cantilever spring 56, FIG. 3, pivotally supporting the load arm 54.

As will be understood by referring again to FIG. 3, those parts of the conductive pattern 78 on the circuit board major portion 86 which are farthest away from the cantilever spring 56 are most likely to contact the top cover 102, FIG. 5, of the apparatus 38 when the load arm 54 is retracted to the phantom position. Only these parts of the conductive pattern 78 are therefore covered by the second pair of circuit board flaps 92 according to the invention. If the second pair of circuit board flaps 92 contact the top cover 102, the exposed part of the conductive pattern on the circuit board major portion 86 will not in any way contact the top cover. It will also be apparent that the contact of the second pair of circuit board flaps 92 presents no problem at all because no conductive pattern is formed on these flaps.

It will also be appreciated that the covering of the required parts of the conductive pattern 78 on the circuit board major portion 86 is made still more complete by the pair of extensions 96 of the second pair of circuit board flaps 92. As best illustrated in FIG. 5, these extensions 96 fit over and cover the rounded edge portions of the circuit board major portion 86, the rounded edges having been produced by folding the first pair of circuit board flaps 88 from the top to the bottom side of the flexure seat central portion 62.

It is understood that the top transducer 44, as well as the bottom transducer 42, is of familiar make known as the tunnel erase head having six leads 74, FIG. 5, with every three of them extending in opposite directions therefrom. The transducer leads 74 are soldered at 104 to the exposed terminal portions of the conductive pattern 78 on the first pair of circuit board flaps 88 which have been folded onto the bottom side of the flexure seat 52.

In FIG. 5 the soldered joints 104 are shown exaggerated in size and spaced substantial distances away from the transducer 44 for illustrative convenience. Actually, however, the soldered joints 104 can be formed much more closer to the transducer 44, so much so that the width W of the transducer inclusive of the soldered joints 104 can be made less than the width $W_1$, FIGS. 1 and 2, of each shutter aperture 26 or 28, and the width $W_2$ of each envelope aperture 20 or 22, of the disk cassette 10.

Consequently, when the disk cassette 10 is loaded in position in the apparatus 38, as illustrated in FIG. 3, the top transducer 42 together with the soldered joints 104 can be thoroughly received in the registered top apertures 20 and 26 of the disk cassette. The soldered joints 104 are therefore not to interfere with tile metal made sliding shutter 24 of the disk cassette 10 even though they are situated on the same side of the flexure seat 52 as the top transducer 42.

It is understood that the leads, not shown, of the bottom transducer 42 are likewise soldered to the flexible printed circuit board, also not shown, on the same side of the bottom flexure seat 50 as the bottom transducer. These soldered joints can therefore be similarly received in the registered bottom apertures 22 and 28 of the disk cassette 10.

A variety of additional modifications, alterations or adaptations of the illustrated embodiment will suggest themselves to one skilled in the art, in order to conform to design preferences or to meet the requirements of each specific application of the invention, without departure from the proper scope or fair meaning of the subjoined claims.

What is claimed is:

1. In an apparatus for data transfer with a rotating data storage disk, in combination:
    (a) carriage means movable, substantially radially of the disk;
    (b) a substantially planar flexure seat mounted to the carriage means, the flexure seat having a first side directed toward the disk and a second side directed away therefrom;
    (c) a flexible printed circuit board having a conductive pattern formed thereon, the circuit board comprising:
        (i) a major portion disposed on the second side of the flexure seat;
        (ii) a first pair of flaps extending in opposite directions from opposite ends of the major portion and folded onto the first side of the flexure seat; and
        (iii) a second pair of flaps extending from the first pair of flaps, respectively, and folded, after having been folded together with the first pair of flaps onto the first side of the flexure seat, back onto the second side of the flexure seat into overlying relationship with at least part of the conductive pattern on the major portion; and
    (d) a transducer mounted on the first side of the flexure seat for writing and/or reading data on the disk, the transducer having leads electrically connected to the conductive pattern on the first pair of flaps of the flexible printed circuit board.

2. The apparatus of claim 1 wherein the second pair of flaps of the flexible printed circuit board are formed to include a pair of extensions which are folded together with the second pair of flaps into overlying relationship with parts of the conductive pattern on the major portion of the circuit board.

3. The apparatus of claim 1 wherein the flexible printed circuit board has the conductive pattern on one side thereof and an adhesive layer on another side thereof whereby the major portion of the circuit board is bonded to the second side of the flexure seat, the first pair of flaps of the circuit board bonded to the first side of the flexure seat, and the second pair of flaps of the circuit board bonded to the major portion of the circuit board on the second side of the flexure seat.

4. In an apparatus for data transfer with a rotating data storage disk, in combination:
(a) carriage means movable substantially radially of the disk;
(b) a substantially planar flexure seat mounted to the carriage means, the flexure seat having a first side directed toward the disk and a second side directed away therefrom, the flexure seat comprising:
(i) a central portion;
(ii) an annular portion surrounding the central portion;
(iii) a first pair of bridges arranged collinearly on opposite sides of the central portion and joining the central portion and the annular portion, so that a pair of openings are formed between the central portion and the annular portion;
(iv) a U shaped portion; and
(v) a second pair of bridges arranged collinearly on opposite sides of the annular portion in right angular relationship to the first pair of bridges and joining the annular portion and the U shaped portion;
(c) a flexible printed circuit board having a conductive pattern formed thereon, the circuit board comprising:
(i) a major portion disposed on the second side of the central portion of the flexure seat;
(ii) a first pair of flaps extending in opposite directions from opposite ends of the major portion and folded through the pair of openings in the flexure seat onto the first side of the central portion of the flexure seat; and
(iii) a second pair of flaps extending right angularly from the first pair of flaps, respectively, and folded, after having been folded together with the first pair of flaps onto the first side of the flexure seat, back onto the second side of the central portion of the flexure seat through the pair of openings in the flexure seat into overlying relationship with at least part of the conductive pattern on the major portion; and
(d) a transducer mounted on the first side of the central portion of the flexure seat for writing and/or reading data on the disk, the transducer having leads electrically connected to the conductive pattern on the first pair of flaps of the flexible printed circuit board.

5. The apparatus of claim 4 wherein the second pair of flaps of the flexible printed circuit board are formed to include a pair of extensions which are folded together with the second pair of flaps into overlying relationship with parts of the conductive pattern on the major portion of the circuit board.

6. The apparatus of claim 4 wherein the major portion of the flexible printed circuit board has an opening formed therein.

7. The apparatus of claim 4 wherein the flexible printed circuit board has the conductive pattern on one side thereof and an adhesive layer on another side thereof whereby the major portion of the circuit board is bonded to the second side of the central portion of the flexure seat, the first pair of flaps of the circuit board bonded to the first side of the central portion of the flexure seat, and the second pair of flaps of the circuit board bonded to the major portion of the circuit board on the second side of the central portion of the flexure seat.

8. In an apparatus for data transfer with a disk cassette including a rotating data storage disk housed in an envelope having a first generally rectangular aperture of predetermined width to expose a radial portion of one side of the disk, the envelope having a sliding shutter with a second aperture formed therein which comes into and out of register with the first aperture, the second aperture being of approximately the same shape and size as the first aperture, in combination:
(a) carriage means movable substantially radially of the disk;
(b) a substantially planar flexure seat mounted to the carriage means, the flexure seat having a first side directed toward the one side of the disk and a second side directed away therefrom;
(c) a flexible printed circuit board having a conductive pattern formed thereon, the circuit board comprising:
(i) a major portion disposed on the second side of the flexure seat;
(ii) a first pair of flaps extending in opposite directions from opposite ends of the major portion and folded onto the first side of the flexure seat; and
(iii) a second pair of flaps extending right angularly from the first pair of flaps, respectively, and folded, after having been folded together with the first pair of flaps onto the first side of the flexure seat, back onto the second side of the flexure seat into overlying relationship with the conductive pattern on the major portion; and
(d) a transducer mounted on the first side of the flexure seat for writing and/or reading data on the one side of the disk through the registered first and second apertures in the disk cassette, the transducer having a plurality of leads which extend in opposite directions therefrom and which are soldered to the conductive pattern on the first pair of flaps of the flexible printed circuit board, thereby providing soldered joints on both sides of the transducer, the soldered joints being positioned close enough to the transducer as to be received, together with the transducer, in the registered first and second apertures in the disk cassette.

* * * * *